US011778871B2

(12) United States Patent
Barel et al.

(10) Patent No.: US 11,778,871 B2
(45) Date of Patent: Oct. 3, 2023

(54) POSITIONING PROXIMITY SENSOR BEHIND OLED DISPLAY

(71) Applicant: Microsoft Technology Licensing, LLC, Redmond, WA (US)

(72) Inventors: Eliyahu Barel, Rosh-HaAyin (IL); Ying Zheng, Sammamish, WA (US); Eran Arbel, Netanya (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 198 days.

(21) Appl. No.: 17/234,637

(22) Filed: Apr. 19, 2021

(65) Prior Publication Data

US 2022/0336560 A1    Oct. 20, 2022

(51) Int. Cl.
```
G06F 3/041      (2006.01)
H10K 59/126     (2023.01)
G01S 17/04      (2020.01)
G09G 3/3233     (2016.01)
```

(52) U.S. Cl.
CPC ........... *H10K 59/126* (2023.02); *G01S 17/04* (2020.01); *G06F 3/041* (2013.01); *G09G 3/3233* (2013.01); *G09G 2320/0247* (2013.01); *G09G 2320/064* (2013.01); *G09G 2360/144* (2013.01); *G09G 2360/145* (2013.01)

(58) Field of Classification Search
CPC ..... H01L 27/3272; G01S 17/04; G06F 3/041; G09G 3/3233; G09G 2320/0247; G09G 2320/064; G09G 2360/144; G09G 2360/145; G09G 2300/0842; G09G 2310/0262; G09G 2310/08; G09G 2354/00; H10K 59/126; H10K 59/00; H04M 1/0266; H04M 2250/12

See application file for complete search history.

(56) References Cited

U.S. PATENT DOCUMENTS

| 5,894,298 A * | 4/1999 | Hoeksma ............ H04M 1/0235 345/102 |
| 2017/0301288 A1* | 10/2017 | Perdices-Gonzalez ...................... G09G 3/3208 |
| 2018/0061315 A1* | 3/2018 | Kim ..................... G09G 3/3275 |
| 2019/0081396 A1* | 3/2019 | Zhou ................... H05K 5/0247 |

(Continued)

FOREIGN PATENT DOCUMENTS

| EP | 3540465 A1 | 9/2019 |
| WO | 2021030530 A1 | 2/2021 |

OTHER PUBLICATIONS

"International Search Report and Written Opinion Issued in PCT Application No. PCT/US22/022974", dated Jul. 13, 2022, 12 Pages.

*Primary Examiner* — Temesghen Ghebretinsae
*Assistant Examiner* — Sosina Abebe
(74) *Attorney, Agent, or Firm* — Alleman Hall Creasman & Tuttle LLP

(57) ABSTRACT

Examples are disclosed that relate to mitigating unintended OLED display emissions arising from a proximity sensor emitter located behind an OLED display panel. One example provides a display device comprising an OLED display panel, a proximity sensor having a proximity sensor emitter positioned behind one or more OLED pixels of the OLED display panel with respect to a viewing surface of the OLED display panel, and a proximity emitter mask positioned between the proximity sensor emitter and the one or more OLED pixels to shield the one or more OLED pixels from the proximity sensor emitter.

20 Claims, 8 Drawing Sheets

(56) References Cited

U.S. PATENT DOCUMENTS

2019/0287463 A1* 9/2019 Zhang ................. G09G 3/3258
2019/0311666 A1 10/2019 Chen
2020/0312927 A1 10/2020 Bae et al.

* cited by examiner

POSITIONING PROXIMITY SENSOR BEHIND OLED DISPLAY

BACKGROUND

A mobile display device, such as a smartphone, may include a proximity sensor to determine when a user is holding the device close to their face, e.g. during a call. The device may control device operation based on such proximity data from the proximity sensor. For example, the mobile display device may disable a display touch sensor and/or reduce a display brightness during the call based upon proximity data. Proximity sensors may be positioned behind a bezel that at least partially surrounds a display screen of a device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to mitigating unintended OLED display emissions arising from a proximity sensor emitter located behind an OLED display panel. One example provides a display device comprising an OLED display panel, a proximity sensor having a proximity sensor emitter positioned behind one or more OLED pixels of the OLED display panel with respect to a viewing surface of the OLED display panel, and a proximity emitter mask positioned between the proximity sensor emitter and the one or more OLED pixels to shield the one or more OLED pixels from the proximity sensor emitter.

Another example provides a method enacted on a display device comprising an organic light emitting diode (OLED) display panel and a proximity sensor having a proximity sensor emitter positioned behind one or more OLED pixels of the OLED display panel with respect to a viewing surface of the OLED display panel. The method comprises determining an emission pattern comprising one or more non-emissive states and one or more emissive states of the one or more OLED pixels, and controlling the proximity sensor emitter to emit during at least a portion of the one or more non-emissive states of the one or more OLED pixels, and not emit during the one or more emissive states of the one or more OLED pixels.

DETAILED DESCRIPTION

As mentioned above, display bezels can be used to house sensors, such as a proximity sensor, in a display device. However, consumer demand continues to rise for devices (e.g. smart phones) having narrow bezels, or no bezels at all, to achieve larger active display areas. Thus, sensors are increasingly being positioned behind the display. However, locating a proximity sensor behind a display may pose challenges. For example, proximity sensors that utilize infrared (IR) emitters, when located behind certain displays such as organic light emitting diode (OLED) displays, may create an undesired blinking artifact as a result of the proximity sensor emitter interacting with the OLED emitters and causing unintended OLED display emissions. This blinking artifact appears in phase with the operation of the IR proximity sensor.

Accordingly, examples are disclosed that relate to mitigating unintended OLED display emissions arising from interactions between a proximity sensor emitter and an OLED display panel in a display device. In some examples, a proximity emitter mask is positioned between the proximity sensor emitter and the OLED display panel to shield OLED pixels from the proximity sensor emitter. A proximity emitter mask may take the form of an IR absorber, reflector, or other material configured to block IR light from the proximity sensor emitter from reaching the OLED pixels, thus helping to prevent interaction between emitted light and OLED pixels. In other examples, an emission pattern of the OLED display panel is detected and then used to control the proximity sensor emitter to emit during at least a portion of non-emissive states of the OLED pixels in front of the proximity sensor, and to not emit during emissive states of the OLED pixels. As unintended OLED emissions from stimulation by the proximity sensor emitter may be reduced when an OLED pixel is in an off state, timing the proximity sensor emitter in this manner may mitigate unintended OLED display emissions. In such examples, data from one or more sensors, such as a behind-display light sensor and/or a display touch sensor, may be used to detect the temporal locations of emissive and non-emissive states of the OLED display panel. Further, in some such examples, during a call event of the display device, a duty cycle of the OLED display panel may be altered to increase a duration of the non-emissive states of the OLED pixels compared to prior to the call event, which may help to increase a time available to the proximity sensor emitter to emit.

Figure 1:
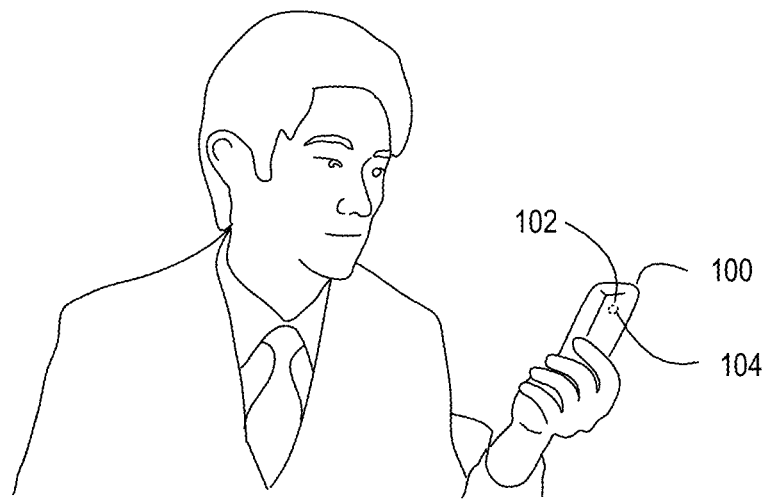
FIG. 1 shows an example display device comprising a proximity sensor positioned behind an OLED display panel.

FIG. 1 shows an example display device 100 in the form of a smart phone that has an OLED display panel 102 and proximity sensor 104 positioned behind the OLED display panel with respect to a viewing surface of the OLED display panel. Proximity sensor 104 may sense when the display device 100 is positioned close to a face during a call, and thus to control a device operation in response. For example, proximity sensing during a call can be used to disable the display and/or a touch sensor of the display device, and/or reduce an intensity of an RF signal transmitted by the device, among other actions.

Figure 2:
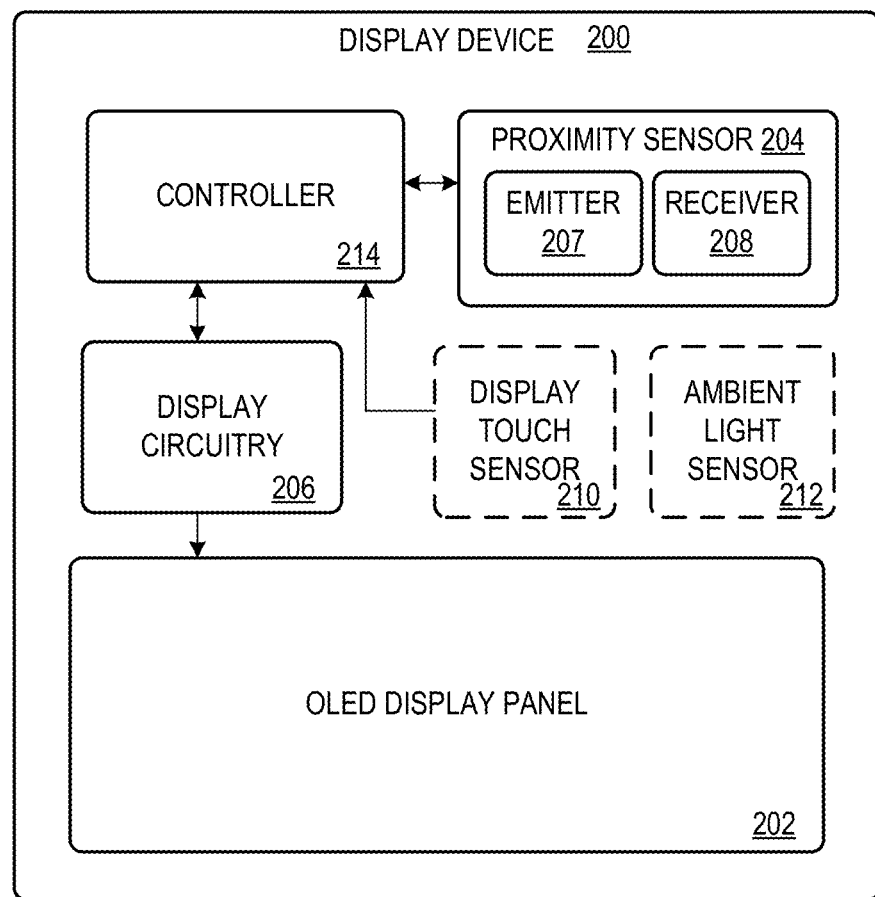
FIG. 2 shows a block diagram of an example display device.

FIG. 2 shows a schematic block diagram of an example display device 200. Display device 200 represents an example implementation of display device 100. Display device 200 comprises an OLED display panel 202, a proximity sensor 204 that is positioned physically behind the OLED display panel 202 with respect to a viewing surface of the OLED display panel, and OLED display circuitry 206. The proximity sensor includes a proximity sensor emitter 207, which can be an infrared (IR) light emitter in some examples. The proximity sensor also includes a proximity sensor receiver 208 configured to detect IR light reflected back from objects in the environment surrounding the display device 100.

OLED display circuitry 206 is configured to control the display of images by controlling emission of light by pixels of the OLED display panel 202, and may include any suitable circuitry, such as an OLED display controller. The emission of light by OLED pixels is temporally modulated (e.g. by PWM cycles and blanking times) and can be configured to emit different color intensities or brightness levels of light by appropriate control of the emissive OLED pixels. Emission of light by the OLED pixels can be controlled independently or in groups in various examples. In some examples, blanking times are fixed over the OLED display panel 202, whereas PWM cycles vary in relation to an OLED display panel brightness and can be applied in a rolling on/off pattern across the OLED display panel 202.

In some examples, display device 200 further comprises an optional display touch sensor 210. Display touch sensor 210 may be positioned in front the OLED display panel 202 from a user perspective, or integrated into the OLED display panel 202. In either case, a coupling can exist between the display touch sensor 210 and an electrode of the OLED display panel, which can result in signal crosstalk, also referred to herein as touch display noise. As described in more detail below, touch display noise may be used to sense transitions between emissive and non-emissive states of OLED display panel 202.

In some examples, display device 200 also comprises an optional ambient light sensor 212. Ambient light sensor 212 also may be positioned physically behind the OLED display panel 202 with respect to a viewing surface of the OLED display panel, or in any other suitable location. Ambient light sensor 212 also may be used to sense emissive and non-emissive states of OLED display panel 202.

Display device 200 further comprises a controller 214 configured to control an operation of the proximity sensor 204, display circuitry 206, optional display touch sensor 210 and ambient light sensor 212, and to receive data samples from the proximity sensor 204, display touch sensor 210, and ambient light sensor 212. The controller 214 can be implemented via a processor, a field programmable gate array (FPGA), application specific integrated circuit (ASIC), and/or other suitable logic computational machine.

Figure 3:
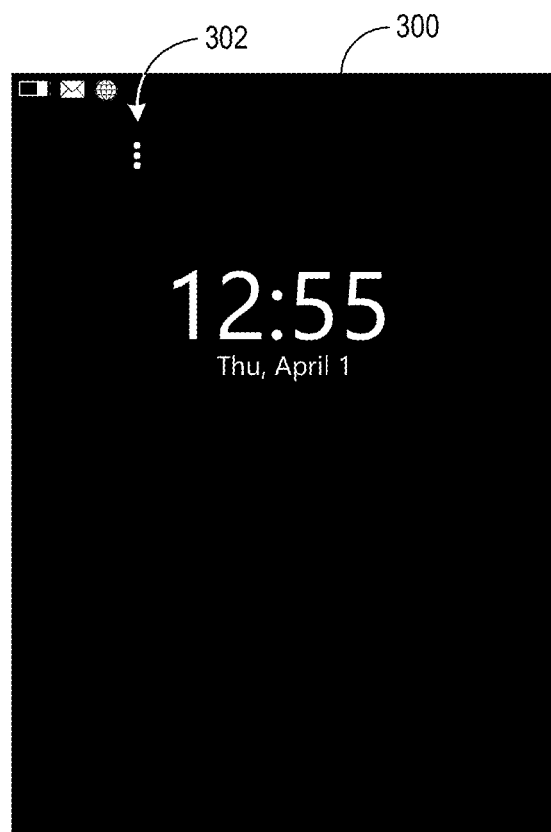
FIG. 3 schematically shows an example display with unintended OLED pixel emissions resulting from a proximity sensor emitter interacting with an OLED display panel.

As mentioned above, the IR emitter of a proximity sensor, when positioned behind an OLED display panel, may interact with the emission of the OLED pixels to cause unintended emission of light by the OLED pixels, which can manifest as a blinking light effect. In some examples, the use of multiple lower-voltage IR emitters may be used in place of a single higher-voltage IR emitter, in order to help reduce the unintended emission. However, such a solution may not completely remove the artifact. FIG. 3 schematically shows an example display 300 with a display artifact 302 caused by the interaction of three lower-voltage IR emitters of a proximity sensor and the OLED pixels in front of it. Such an artifact may be distracting to a user, for example, during a video call in which the proximity sensor is active, but the device is not held against the face.

Figure 4:
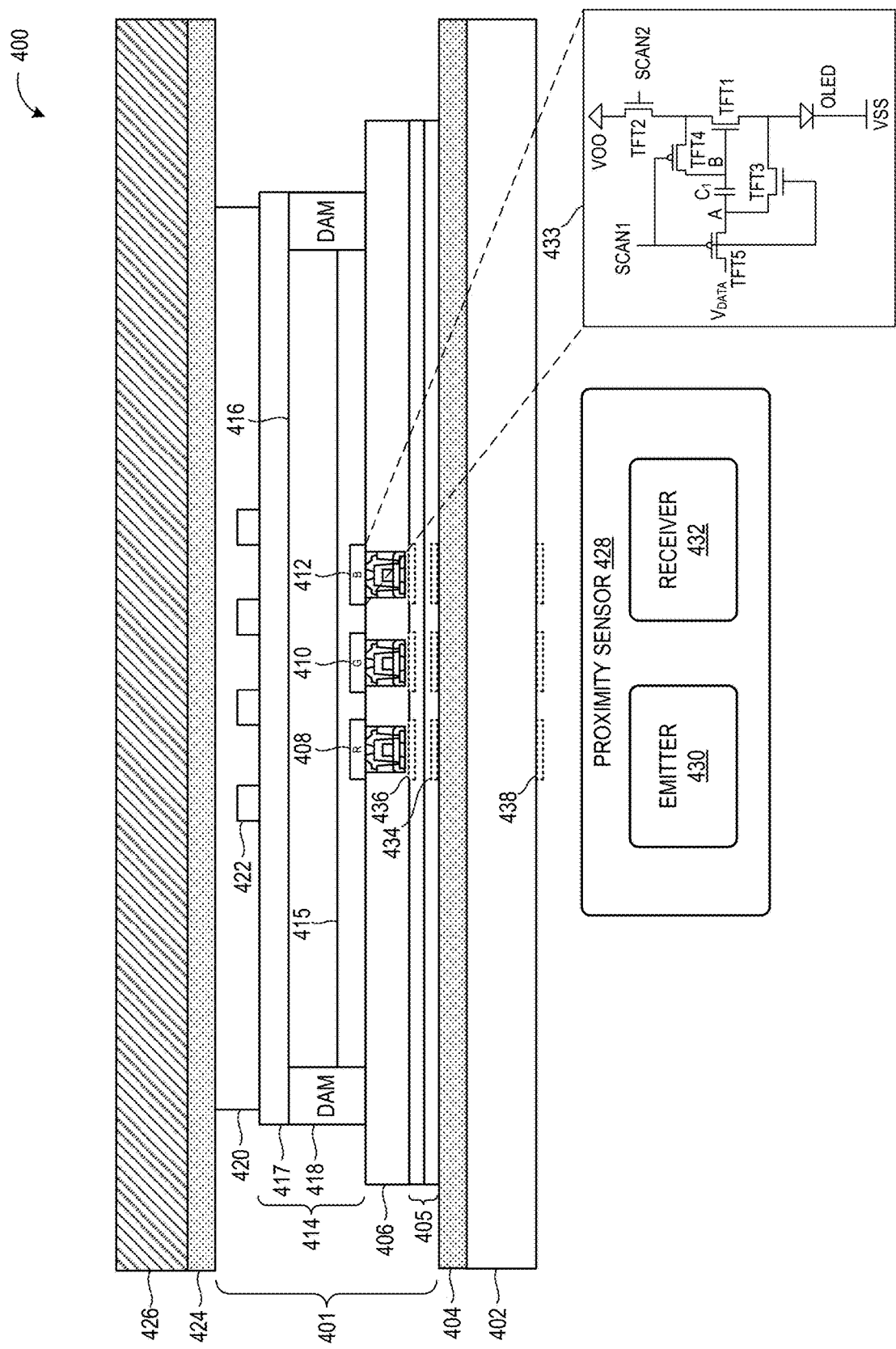
FIG. 4 shows an example OLED display panel module.

One solution to unintended OLED display emission caused by a proximity sensor emitter interaction is to place a proximity emitter mask between a proximity sensor emitter and an OLED display panel to shield OLED pixels from the proximity sensor emitter. FIG. 4 shows a schematic depiction of an example OLED display module 400 comprising an OLED pixel 401. OLED display module 400 comprises a back plate 402 coupled to a substrate 405 via an adhesive 404. Substrate 405 includes printed conductors to provide power to OLED pixel 401. OLED pixel 401 comprises a backplane 406 in which electronics for controlling OLED sub-pixels 408, 410, and 412 (representing red, green, and blue sub-pixels) are located. Each OLED sub-pixel includes an anode layer and a contact pad to provide current to the sub-pixel. Backplane 406 may be formed of polysilicon, and substrate 405 may be formed of polyimide, as examples, although it will be understood that any other suitable materials may be used to form backplane 406 and substrate 405. Substrate 405 may have multiple layers as shown, or may be a single layer in other examples.

The OLED display panel module 400 further includes a thin film encapsulation structure 414 comprising an inorganic layer (e.g. silicon nitride or silicon oxide) 415, an organic layer 416, two dams 418 to contain organic layer 416 during deposition of the organic layer (which may be deposited by jet printing or spin coating, for example), and a second inorganic layer 417. OLED display panel module 400 further includes cathode layer 420 comprising a cathode 422, an adhesive 424, and a polarizer 426 coupled to the cathode layer 420 via adhesive 424. An example proximity sensor is shown schematically at 428, and includes an emitter 430 and a receiver 432.

It will be understood that each sub-pixel 408, 410, and 412 comprises a control circuit with multiple thin film transistors (for OLED modulation, brightness level, compensation, etc.) and a capacitor. At 433, FIG. 4 shows a schematic view of an example OLED drive circuit for an OLED sub-pixel. The current that drives each sub-pixel and therefore the brightness of each sub-pixel is controlled by TFT1, depending on the charge stored on C1. Before each sub-pixel is turned on, C1 is charged to the appropriate level ($V_{DATA}$) by setting SCAN1 to low. Once SCAN2 goes high, TFT2 turns on and allows current to flow through the OLED sub-pixel as modulated by TFT1. SCAN2 is also used to apply the PWM modulation to reduce the overall display brightness by applying a square waveform at a multiple of the display frame rate of 60 Hz. The duty cycle of the square wave therefore controls the display brightness. The term "OLED pixel" as used herein includes any portion of an OLED pixel, including sub-pixels and sub-pixel circuitry, and a proximity sensor emitter mask may be configured to protect all pixel structures, or select pixel substructures, in various examples.

Figure 5:
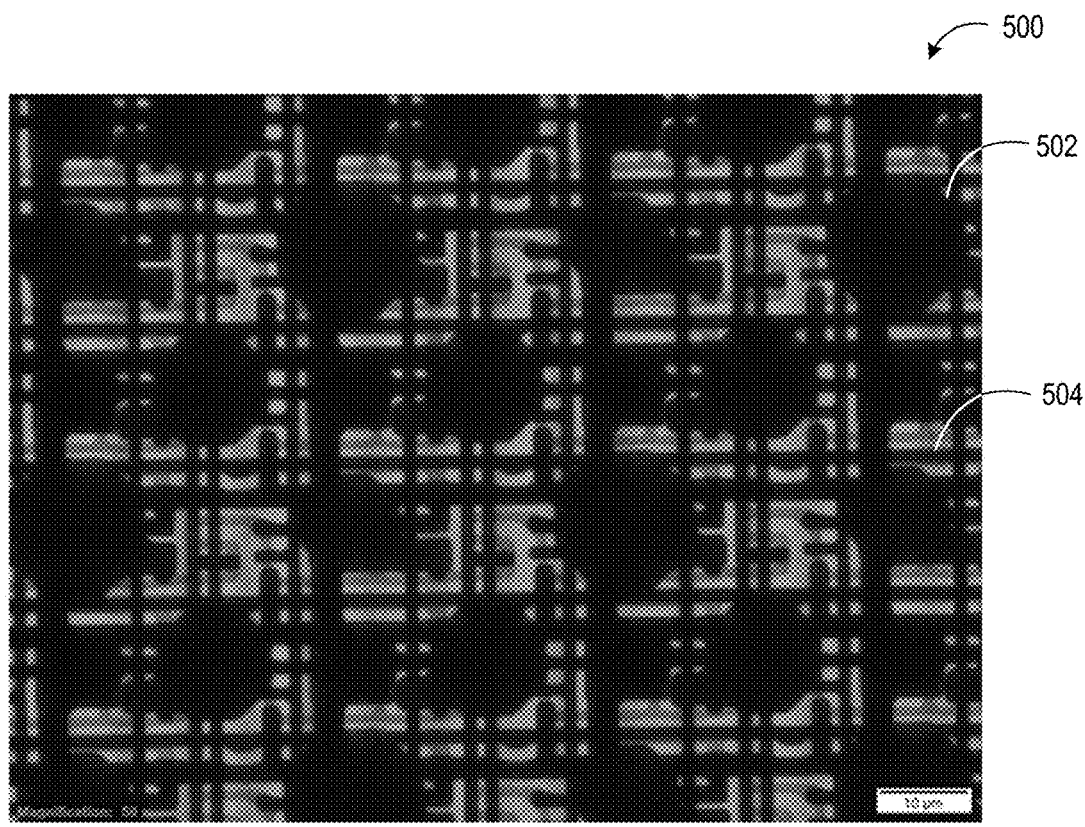
FIG. 5 shows a photo of a magnified view of a portion of an example OLED pixel.
Figure 6:
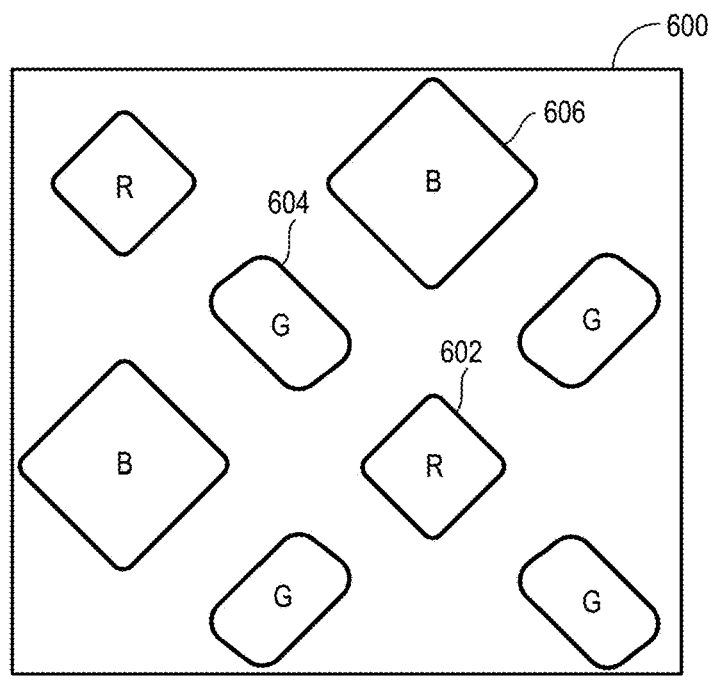
FIG. 6 shows a schematic representation of a magnified view of a portion of an example OLED pixel.

FIG. 5 shows a magnified image 500 of a portion of an example OLED pixel, which may be representative of OLED pixel 401. The OLED pixel includes red, green, and blue sub-pixels 502, shown as differently sized dark circles, and printed conductors 504. FIG. 6 shows a schematic representation of an OLED pixel 600, and may be representative of the OLED pixel shown in photo 500. Here, only the sub-pixel layer is shown. OLED pixel 600 includes a plurality of sub-pixels, including red sub-pixel 602, green sub-pixel 604, and blue sub-pixel 606.

Figure 7:
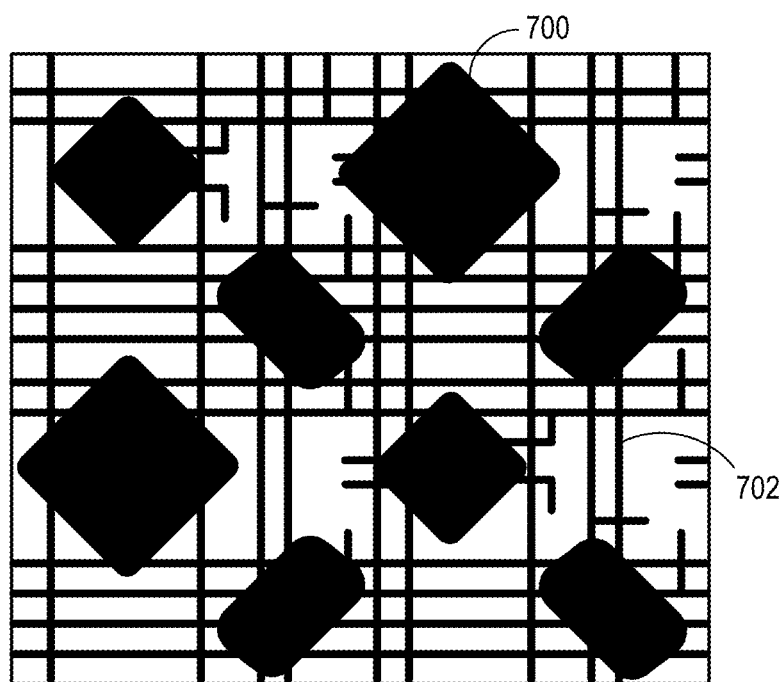
FIG. 7 shows a schematic representation of a portion of an example proximity emitter mask for the OLED pixel of FIG. 6.

As mentioned above, OLED pixels that are illuminated by a proximity sensor emitter located behind an OLED display panel may interact with the emission of the proximity sensor emitter. In particular, because each sub-pixel within an OLED pixel may have its own sub-pixel circuit, each sub-pixel may be sensitive to light emitted by the proximity sensor emitter. Thus, in some examples, a proximity emitter mask may be positioned between a proximity sensor emitter and OLED pixels to shield the OLED pixels from proximity sensor emissions. FIG. 7 schematically shows a representation of a portion of an example proximity emitter mask 700 for the portion of OLED pixel 600. As shown, proximity emitter mask 700 is configured to shield the OLED sub-pixels of FIG. 6. In this example, proximity emitter mask 700 can take the form of a printed metal structure that is integrated with printed circuitry 702 for the OLED pixel, and thus may be located on a substrate layer of the OLED pixel (e.g. substrate 405). An example of such a mask is shown schematically in FIG. 4 by dashed lines at 434. In some examples, the proximity emitter mask 700 may be integrated with ground lines. By integrating proximity emitter mask 700 with printed circuitry for the OLED pixel, proximity emitter mask 700 may be manufactured in a same process step as the printed circuitry, thus saving production costs and time.

In some examples, as mentioned above, a substrate layer of the OLED pixel may have multiple layers. Thus, a proximity emitter mask that is integrated into the printed circuitry of the OLED pixel may be distributed among the multiple layers of the substrate. In other examples, instead of being integrated with printed circuitry for the OLED pixel, a proximity sensor emitter mask may comprise a layer of an IR absorber, IR reflector, or other material configured to block IR light from reaching the OLED pixels that is different from the metal layer(s) that form the printed circuitry on the substrate. In some examples, a current OLED device fabrication process can be used to form a proximity sensor emitter mask, such as a process for forming metal interconnects on a substrate. In such examples, a proximity sensor mask may be formed in a same process step as other currently-used OLED structures (e.g. the masks may be formed with metal ground lines), or in a different step using currently-used materials that are IR-absorbing or reflecting. In other examples, a proximity emitter mask can be formed from a material that is not currently used in OLED processes (e.g. black matrix used in liquid crystal displays to separate color filters), and thus may involve one or more additional process steps not currently used in an OLED process. As one example, the proximity emitter mask may comprise a coating layer on the underside of the backplane on which the OLED sub-pixels are fabricated. Referring to FIG. 4, such a proximity emitter mask may be patterned on a side of backplane 406 that faces substrate 405, as shown schematically in dashed lines in FIG. 4 at 436. In other such examples, the proximity emitter mask may be located on back plate 402, as shown schematically in dashed lines in FIG. 4 at 438, or at any other suitable location. Locating the proximity emitter mask on the back plate provide the advantage that the proximity emitter mask can be deposited on the back plate 402 (e.g. by printing, physical vapor deposition such as sputtering or evaporation, or by any other suitable process) before adhering the back plate 402 to the substrate 405.

Figure 8:
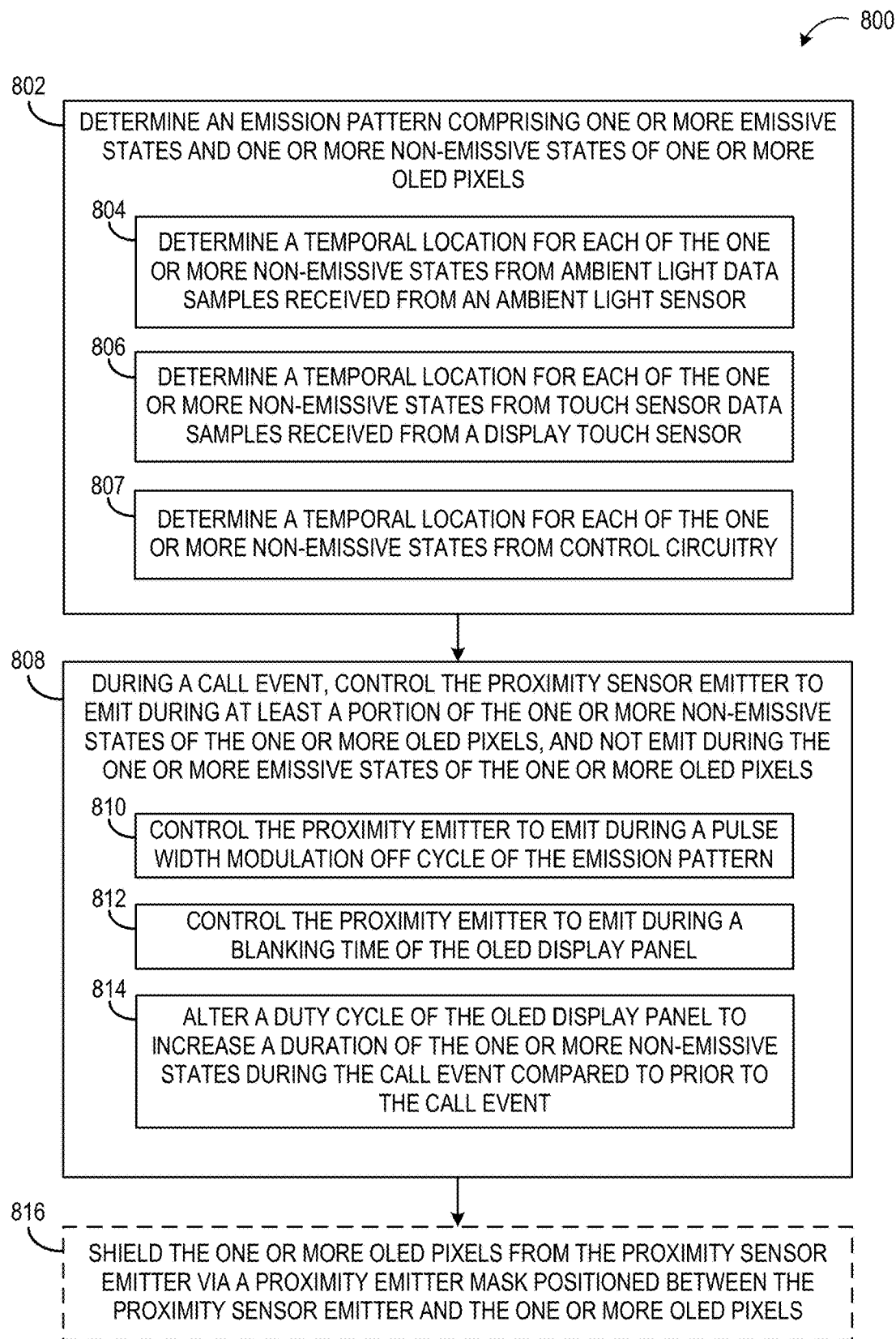
FIG. 8 shows an example method of reducing a display distortion caused by interaction between a proximity sensor emitter and an OLED display panel.

The examples described above utilize a physical masking layer to shield OLED pixels from a proximity sensor emitter. In other examples, the proximity sensor emitter may be controlled to emit during non-emissive states of the OLED pixels in front of the proximity sensor, and to not emit during emissive states of the OLED pixels. Unintended OLED emission resulting from interaction between the proximity sensor emitter and the OLED pixels may be mitigated by timing the proximity sensor emitter pulses in the disclosed manner. FIG. 8 shows an example method 800 of mitigating unintended OLED emissions in a display device having a proximity sensor emitter positioned behind one or more OLED pixels of an OLED display panel with respect to a viewing surface of the OLED display panel. Method 800 includes, at 802, determining an emission pattern comprising one or more emissive states and one or more non-emissive states of the one or more OLED pixels that are in front of the proximity sensor emitter. Such emissive and non-emissive states of the one or more OLED pixels may occur in a regular pattern due, for example, to pulse width modulation (PWM) control of pixel brightness as well as a blanking pattern used by the OLED display panel, which depends on a refresh rate of the display (e.g. 20, 60, 90, 120 Hz).

Any suitable data may be used to determine the temporal location of the emissive and/or non-emissive states of the one or more OLED pixels. For example, as indicated at 804, the temporal locations of the emissive and/or non-emissive states can be determined from light sensor data, such as data from an ambient light sensor positioned behind the OLED display. Locations of higher sensed intensity correspond to ambient light plus display back emission and thus represent emissive periods of the one or more OLED pixels. Likewise, locations of lower sensed intensity correspond to ambient light only, and thus represent non-emissive periods. Such non-emissive periods include PWM non-emissive cycles and blanking time. Emissive/non-emissive patterns of an OLED display panel can be learned during production (e.g. by checking back emission level with different background and brightness levels), and/or adaptively learned and/or updated over device lifetime. In some examples, a status bar area (e.g. where clock, battery, connectivity, and/or other information may be displayed) of the OLED display panel can be sensed by the light sensor to learn emissive/non-emissive patterns of the OLED display panel, as a status bar may have predefined color definition per application which can be easily studied.

In some examples, temporal locations of emissive and non-emissive states can alternatively or additionally be determined using data samples received from a display touch sensor, as indicated at 806. As mentioned above, the control of the OLED display panel can cause touch display noise resulting from coupling between the display touch sensor and electrodes of the OLED display panel. Thus, from the touch display noise, the temporal locations of emissive and non-emissive states of the OLED display panel can be determined, potentially in combination with light sensor data to identify the OLED display state (emissive or non-emissive) between touch display noise events.

In yet other examples, the temporal location of the emissive/non-emissive states can be determined based at least in part upon control data, e.g. received from OLED display control circuitry, as shown at 807. The control data may comprise, for example, information related to an emission of light by pixels of the OLED display panel. Such information may comprise one or more of light intensity, color intensity, and temporal location of the emission of light of one or more pixels of the OLED display panel.

At 808, method 800 further includes, during a call event (e.g. an incoming or outgoing telephone call), controlling the proximity sensor emitter to emit during at least a portion the one or more non-emissive states of the one or more OLED pixels, and not emit during the one or more emissive states of the one or more OLED pixels. As mentioned above, because non-emissive periods may include PWM off cycles and blanking times, controlling the proximity sensor emitter may include, at 810, controlling the proximity emitter to emit during a PWM off cycle of the emission pattern, and at 812, controlling the proximity emitter to emit during a blanking time of the OLED display panel.

Figure 9:
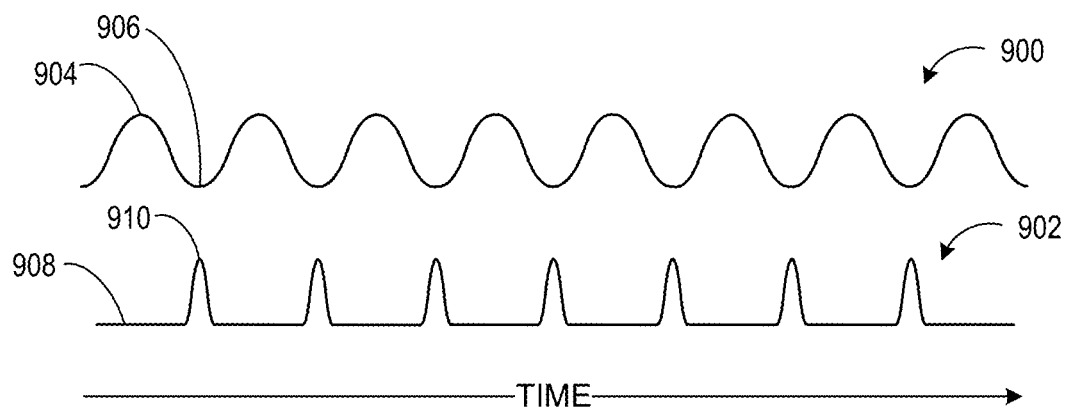
FIGS. 9-11 show example emission patterns for one or more OLED pixels positioned in front of a proximity sensor compared to an emission pattern for the proximity sensor emitter.
Figure 10:
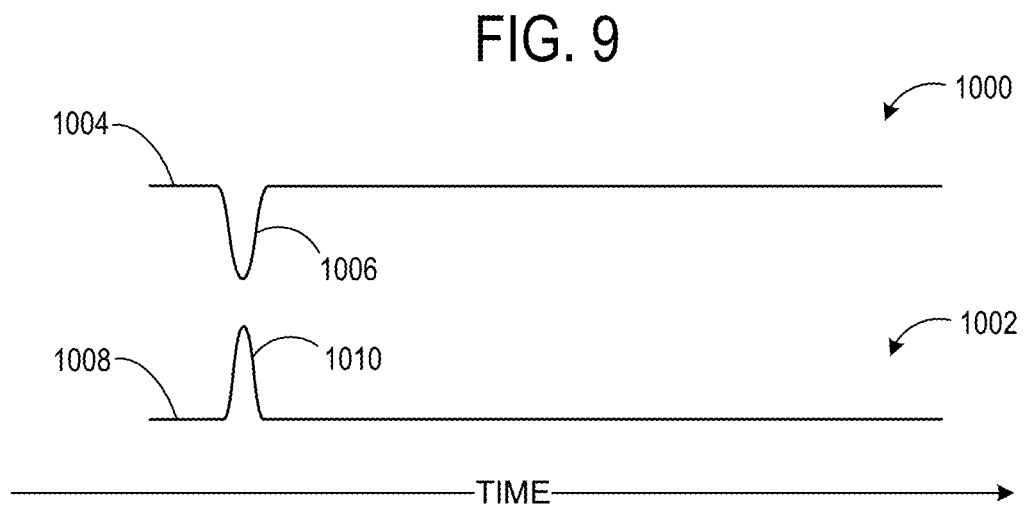
Figure 11:
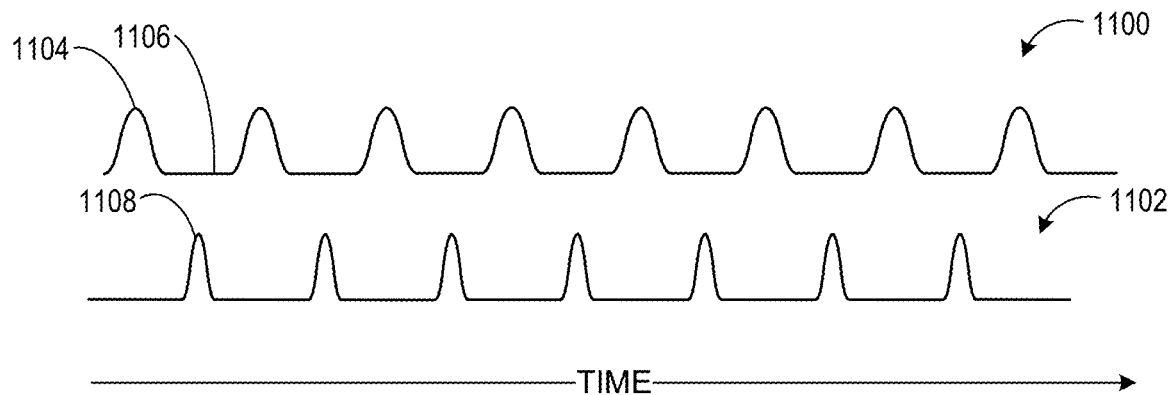

FIGS. 9-11 each show a timing diagram schematically representing an example emission pattern for one or more OLED pixels in front of a proximity sensor compared to a timing diagram for emitting from the proximity sensor emitter. In FIG. 9, timing diagram 900 shows an OLED emission pattern comprising emissive states 904 (PWM emissive cycles) and non-emissive states (PWM non-emissive cycles) 906. The width of PWM non-emissive cycles is a function of display brightness. OLED emission pattern 900 may represent a display brightness level where the PWM is 50%, meaning the OLED pixels are emissive approximately 50% of the time, and non-emissive 50% of the time. As such, the corresponding pattern for the proximity sensor emission includes emitting at 910 when the OLED pixels are non-emissive and not emitting at 908 when the OLED pixels are emissive. This may mitigate the appearance of the blinking distortion of the OLED display panel in the area of the proximity sensor.

FIG. 10 shows timing diagram 1000 representing an OLED emission pattern comprising emissive states 1004 and non-emissive states 1006. In this example, the timing diagram 1000 represents a PWM of 100%, where the OLED pixels are emissive almost all of the time, except for non-emissive state 1006 which represents a blanking time. The timing of blanking times is a function of a refresh rate of the OLED display panel. Correspondingly, an emission pattern 1002 for the proximity sensor emitter may be controlled to not emit for a majority of the time, at 1008, and to emit at 1010 during the blanking time 1006.

In some examples, by adjusting the OLED display brightness and/or refresh rate, a duration of the non-emissive states may be increased in order to increase an amount of time available for the proximity sensor emitter to emit. FIG. 11 shows timing diagram 1100 representing an OLED emission pattern 1100 at a lower brightness level compared to that of FIG. 9, where the PWM is 30%, comprising emissive states 1104 approximately 30% of the time, and non-emissive states 1106 approximately 70% of the time. Here, the OLED pixels are off for longer periods of time compared to OLED emission pattern 900, and therefore emission pattern 1102 for the proximity sensor emitter may include emitting (1108) during a smaller portion of the non-emissive states 1106 of the OLED pixels, helping to further reduce interaction and display distortion. The brightness of the OLED display may be lowered, for example, during a call event on the display device, such that the longer pulse off times may be less likely to affect a user experience. This may be achieved, for example, by adjusting an emissive pattern for the OLED display from emission pattern 900 to emission pattern 1100 during the call event.

Thus, returning to FIG. 8, method 800 also includes, at 814, altering a duty cycle of the OLED display panel to increase a duration of the one or more non-emissive states during the call event compared to prior to the call event. As described above, reducing display brightness and/or reducing a refresh rate may provide a low duty cycle, leading to longer pulse off times, and thus pose less opportunity for the proximity sensor emitter and the OLED pixels to interact. The reduction of display brightness and/or refresh rate may have little impact on a user experience when such adjustments occur during a call event, as the user may not be actively using the display during this time.

As mentioned above, in some examples a proximity emitter mask may be positioned between the proximity sensor emitter and the one or more OLED pixels to reduce interaction between the two. Thus, method 800 optionally includes, at 816, shielding the one or more OLED pixels from the proximity sensor emitter via a proximity emitter mask positioned between the proximity sensor emitter and the one or more OLED pixels. The proximity emitter mask may take the form of a patterned metal layer that is integrated with drive circuitry for the OLED display panel, or a separate layer that is positioned at any suitable location between the proximity sensor emitter and the OLED pixels.

In some embodiments, the methods and processes described herein may be tied to a computing system of one or more computing devices. In particular, such methods and processes may be implemented as a computer-application program or service, an application-programming interface (API), a library, and/or other computer-program product.

Figure 12:
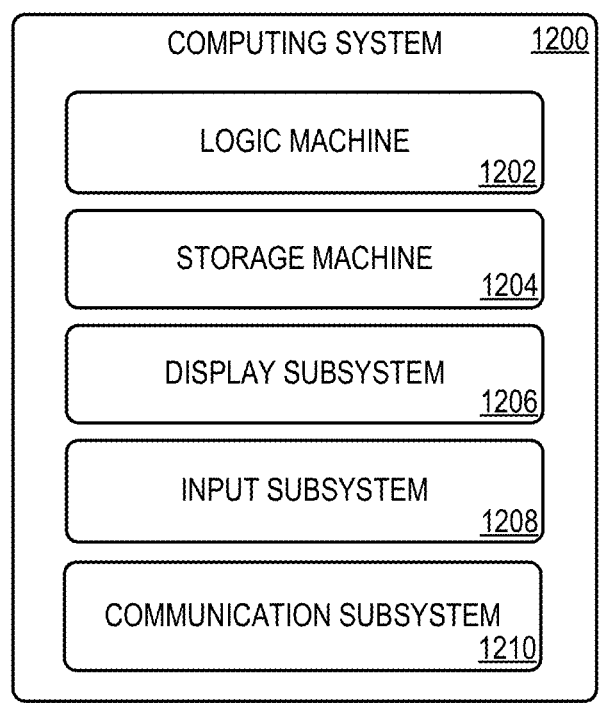
FIG. 12 shows a block diagram depicting an example computing device.

FIG. 12 schematically shows a non-limiting embodiment of a computing system 1200 that can enact one or more of the methods and processes described above. Computing system 1200 is shown in simplified form. Computing system 1200 may take the form of one or more personal computers, server computers, tablet computers, home-entertainment computers, network computing devices, gaming devices, mobile computing devices, mobile communication devices (e.g., smart phone), and/or other computing devices.

Computing system 1200 includes a logic machine 1202 and a storage machine 1204. Computing system 1200 may optionally include a display subsystem 1206, input subsystem 1208, communication subsystem 1210, and/or other components not shown in FIG. 12.

Logic machine 1202 includes one or more physical devices configured to execute instructions. For example, logic machine 1202 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Logic machine 1202 may include one or more processors configured to execute software instructions. Additionally or alternatively, logic machine 1202 may include one or more hardware or firmware logic machines configured to execute hardware or firmware instructions. Processors of logic machine 1202 may be single-core or multi-core, and the instructions executed thereon may be configured for sequential, parallel, and/or distributed processing. Individual components of logic machine 1202 optionally may be distributed among two or more separate devices, which may be remotely located and/or configured for coordinated processing. Aspects of logic machine 1202 may be virtualized and executed by remotely accessible, networked computing devices configured in a cloud-computing configuration.

Storage machine 1204 includes one or more physical devices configured to hold instructions executable by logic machine 1204 to implement the methods and processes described herein. When such methods and processes are implemented, the state of storage machine 1204 may be transformed—e.g., to hold different data.

Storage machine 1204 may include removable and/or built-in devices. Storage machine 1204 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1204 may include volatile, nonvolatile, dynamic, static, read/write, read-only, random-access, sequential-access, location-addressable, file-addressable, and/or content-addressable devices.

It will be appreciated that storage machine 1204 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1202 and storage machine 1204 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1206 may be used to present a visual representation of data held by storage machine 1204. This visual representation may take the form of a graphical user interface (GUI). As the herein described methods and processes change the data held by the storage machine, and thus transform the state of the storage machine, the state of display subsystem 1206 may likewise be transformed to visually represent changes in the underlying data. Display subsystem 1206 may include one or more display devices utilizing virtually any type of technology. Such display devices may be combined with logic machine 1202 and/or storage machine 1204 in a shared enclosure, or such display devices may be peripheral display devices.

When included, input subsystem 1208 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1210 may be configured to communicatively couple computing system 1200 with one or more other computing devices. Communication subsystem 1210 may include wired and/or wireless communication devices compatible with one or more different communication protocols. As non-limiting examples, communication subsystem 1210 may be configured for communication via a wireless telephone network, or a wired or wireless local- or wide-area network. In some embodiments, communication subsystem 1210 may allow computing system 1200 to send and/or receive messages to and/or from other devices via a network such as the Internet.

Another example provides a display device, comprising an OLED display panel, a proximity sensor having a proximity sensor emitter positioned behind one or more OLED pixels of the OLED display panel with respect to a viewing surface of the OLED display panel, and a proximity emitter mask positioned between the proximity sensor emitter and the one or more OLED pixels to shield the one or more OLED pixels from the proximity sensor emitter. The proximity sensor emitter may additionally or alternatively include an infrared emitter, and wherein the proximity emitter mask comprises an IR absorber. The proximity emitter mask may additionally or alternatively include a patterned metal layer. The patterned metal layer is integrated with drive circuitry for the OLED display panel. The OLED display panel may additionally or alternatively include a substrate including printed conductors positioned behind the one or more OLED pixels with respect to the viewing surface of the OLED display panel, wherein the proximity emitter mask is positioned on the substrate. The substrate may additionally or alternatively include a plurality of substrate layers, and wherein the proximity emitter mask comprises portions formed on each layer of the plurality of substrate layers. The OLED display panel may additionally or alternatively include a substrate including printed conductors, and a backplane positioned in front of the substrate with respect to the viewing surface of the OLED display panel, wherein the one or more OLED pixels are mounted on the backplane, and wherein the proximity emitter mask is positioned on the backplane behind the one or more OLED pixels with respect to the viewing surface of the OLED display panel. The OLED display panel may additionally or alternatively include a back plate, wherein the proximity emitter mask is positioned on the back plate of the OLED display panel.

Another example provides a method enacted on a display device comprising an organic light emitting diode (OLED) display panel and a proximity sensor having a proximity sensor emitter positioned behind one or more OLED pixels of the OLED display panel with respect to a viewing surface of the OLED display panel, the method comprising determining an emission pattern comprising one or more non-emissive states and one or more emissive states of the one or more OLED pixels, and during a call event, controlling the proximity sensor emitter to emit during at least a portion of the one or more non-emissive states of the one or more OLED pixels, and not emit during the one or more emissive states of the one or more OLED pixels. Controlling the proximity emitter may additionally or alternatively include controlling the proximity emitter to emit during a pulse width modulation off cycle of the emission pattern. Controlling the proximity emitter may additionally or alternatively include controlling the proximity emitter to emit during a blanking time of the OLED display panel. Determining the emission pattern of the one or more OLED pixels may additionally or alternatively include determining a temporal location for each of the one or more non-emissive states from touch sensor data samples received from a display touch sensor of the display device. Determining the emission pattern of the one or more OLED pixels may additionally or alternatively include determining a temporal location for each of the one or more non-emissive states from control data received from OLED display control circuitry. Determining the emission pattern of the one or more OLED pixels may additionally or alternatively include determining a temporal location for each of the one or more non-emissive states from ambient light data samples received from an ambient light sensor of the display device.

The method may additionally or alternatively include altering a duty cycle of the OLED display panel to increase a duration of the one or more non-emissive states during the call event compared to prior to the call event. The method may additionally or alternatively include shielding the one or more OLED pixels from the proximity sensor emitter via a proximity emitter mask positioned between the proximity sensor emitter and the one or more OLED pixels.

Another example provides a display device, comprising an OLED display panel, a proximity sensor having a proximity sensor emitter positioned behind one or more OLED pixels of OLED display panel with respect to a viewing surface of the OLED display panel, and a patterned metal layer forming mask regions positioned between the proximity sensor emitter and the one or more OLED pixels to shield the one or more OLED pixels from the proximity sensor emitter. The patterned metal layer may additionally or alternatively be integrated with drive circuitry for the OLED display panel. The OLED display panel may additionally or alternatively include a substrate including printed conductors positioned behind the one or more OLED pixels with respect to a viewing surface of the OLED display panel, and wherein the patterned metal layer is formed on the substrate. The substrate may additionally or alternatively include a plurality of substrate layers, and wherein the patterned metal layer comprises portions formed on each of the substrate layers.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
   an OLED display panel;
   a proximity sensor having a proximity sensor emitter positioned behind one or more OLED pixels of the OLED display panel with respect to a viewing surface of the OLED display panel; and
   a proximity emitter mask positioned between the proximity sensor emitter and the one or more OLED pixels to shield the one or more OLED pixels from the proximity sensor emitter, wherein the display device is configured to,
      determine an emission pattern comprising one or more non-emissive states and one or more emissive states of the one or more OLED pixels,
      wherein each of the one or more non-emissive states comprises a temporal location determined from touch sensor data samples received from a display touch sensor of the display device, and
      during a call event, control the proximity sensor emitter to emit during at least a portion of the one or more non-emissive states of the one or more OLED pixels, and not emit during the one or more emissive states of the one or more OLED pixels.

2. The display device of claim 1, wherein the proximity sensor emitter comprises an infrared emitter, and wherein the proximity emitter mask comprises an IR absorber.

3. The display device of claim 1, wherein the proximity emitter mask comprises a patterned metal layer.

4. The display device of claim 3, wherein the patterned metal layer is integrated with drive circuitry for the OLED display panel.

5. The display device of claim 1, wherein the OLED display panel comprises a substrate including printed conductors positioned behind the one or more OLED pixels with respect to the viewing surface of the OLED display panel, wherein the proximity emitter mask is positioned on the substrate.

6. The display device of claim 5, wherein the substrate comprises a plurality of substrate layers, and wherein the proximity emitter mask comprises portions formed on each layer of the plurality of substrate layers.

7. The display device of claim 1, wherein the OLED display panel comprises a substrate including printed conductors, and a backplane positioned in front of the substrate with respect to the viewing surface of the OLED display panel, wherein the one or more OLED pixels are mounted on the backplane, and wherein the proximity emitter mask is positioned on the backplane behind the one or more OLED pixels with respect to the viewing surface of the OLED display panel.

8. The display device of claim 1, wherein the OLED display panel comprises a back plate, and wherein the proximity emitter mask is positioned on the back plate of the OLED display panel.

9. The display device of claim 1, wherein the display device is further configured to determine the temporal location for each of the one or more non-emissive states from ambient light data samples received from an ambient light sensor of the display device.

10. A method enacted on a display device comprising an organic light emitting diode (OLED) display panel and a proximity sensor having a proximity sensor emitter positioned behind one or more OLED pixels of the OLED display panel with respect to a viewing surface of the OLED display panel, the method comprising:
    determining an emission pattern comprising one or more non-emissive states and one or more emissive states of the one or more OLED pixels,
    wherein determining the emission pattern of the one or more OLED pixels comprises determining a temporal location for each of the one or more non-emissive states from ambient light data samples received from an ambient light sensor of the display device, and
    during a call event, controlling the proximity sensor emitter to emit during at least a portion of the one or more non-emissive states of the one or more OLED pixels, and not emit during the one or more emissive states of the one or more OLED pixels.

11. The method of claim 10, wherein controlling the proximity emitter comprises controlling the proximity emitter to emit during a pulse width modulation off cycle of the emission pattern.

12. The method of claim 10, wherein controlling the proximity emitter comprises controlling the proximity emitter to emit during a blanking time of the OLED display panel.

13. The method of claim 10, wherein determining the emission pattern of the one or more OLED pixels further comprises determining the temporal location for each of the one or more non-emissive states from touch sensor data samples received from a display touch sensor of the display device.

14. The method of claim 10, wherein determining the emission pattern of the one or more OLED pixels further comprises determining the temporal location for each of the one or more non-emissive states from control data received from OLED display control circuitry.

15. The method of claim 10, further comprising, altering a duty cycle of the OLED display panel to increase a duration of the one or more non-emissive states during the call event compared to prior to the call event.

16. The method of claim 10, further comprising shielding the one or more OLED pixels from the proximity sensor emitter via a proximity emitter mask positioned between the proximity sensor emitter and the one or more OLED pixels.

17. A display device, comprising:
an OLED display panel;
a proximity sensor having a proximity sensor emitter positioned behind one or more OLED pixels of OLED display panel with respect to a viewing surface of the OLED display panel; and
a patterned metal layer forming mask regions positioned between the proximity sensor emitter and the one or more OLED pixels to shield the one or more OLED pixels from the proximity sensor emitter, wherein the display device is configured to,
determine an emission pattern comprising one or more non-emissive states and one or more emissive states of the one or more OLED pixels,
wherein each of the one or more non-emissive states comprises a temporal location determined from touch sensor data samples received from a display touch sensor of the display device, and
during a call event, control the proximity sensor emitter to emit during at least a portion of the one or more non-emissive states of the one or more OLED pixels, and not emit during the one or more emissive states of the one or more OLED pixels.

18. The display device of claim 17, wherein the patterned metal layer is integrated with drive circuitry for the OLED display panel.

19. The display device of claim 17, wherein the OLED display panel comprises a substrate including printed conductors positioned behind the one or more OLED pixels with respect to a viewing surface of the OLED display panel, and wherein the patterned metal layer is formed on the substrate.

20. The display device of claim 19, wherein the substrate comprises a plurality of substrate layers, and wherein the patterned metal layer comprises portions formed on each of the substrate layers.

\* \* \* \* \*